United States Patent
Bains et al.

(10) Patent No.: US 10,522,207 B2
(45) Date of Patent: *Dec. 31, 2019

(54) PERFORMANCE OF ADDITIONAL REFRESH OPERATIONS DURING SELF-REFRESH MODE

(71) Applicant: Intel Corporation, Santa Clara, CA (US)

(72) Inventors: Kuljit S. Bains, Olympia, WA (US); Shay Fux, Kfar Yona (IL); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/665,143

(22) Filed: Jul. 31, 2017

(65) Prior Publication Data

US 2018/0047439 A1    Feb. 15, 2018

Related U.S. Application Data

(63) Continuation of application No. 15/184,944, filed on Jun. 16, 2016, now Pat. No. 9,721,640.

(60) Provisional application No. 62/265,054, filed on Dec. 9, 2015.

(51) Int. Cl.
*G11C 7/00* (2006.01)
*G11C 11/406* (2006.01)
*G11C 11/4074* (2006.01)

(52) U.S. Cl.
CPC .... *G11C 11/40615* (2013.01); *G11C 11/4074* (2013.01); *G11C 2211/4067* (2013.01)

(58) Field of Classification Search
CPC .................... G11C 11/40615; G11C 11/4074
USPC ......................................................... 365/222
See application file for complete search history.

(56) References Cited

U.S. PATENT DOCUMENTS

| | | | |
|---|---|---|---|
| 6,167,484 A | 12/2000 | Boyer et al. | |
| 6,930,944 B2 | 8/2005 | Hush | |
| 8,982,654 B2 | 3/2015 | Dong et al. | |
| 9,001,608 B1 | 4/2015 | Chishti et al. | |
| 9,721,640 B2 * | 8/2017 | Bains ................ | G11C 11/40615 |
| 2002/0191467 A1 * | 12/2002 | Matsumoto ........... | G11C 11/406 365/222 |

(Continued)

OTHER PUBLICATIONS

International Search Report and Written Opinion for PCT Patent Application No. PCT/US16/59747 dated Feb. 9, 2017, 15 pages.

*Primary Examiner* — Huan Hoang
(74) *Attorney, Agent, or Firm* — Compass IP Law PC (57) ABSTRACT

Embodiments are generally directed to performance of additional refresh operations during self-refresh mode. An embodiment of a memory device includes one or more memory banks, a mode register set, the mode register set including a first set of mode register bits, and a control logic to provide control operations for the memory device, the operations including refresh operations for the one or more memory banks in a refresh credit mode. The control logic is to perform one or more extra refresh cycles in response to receipt of a self-refresh command, the self-refresh command to provide current refresh status information, and is to store information in the first set of mode register bits regarding a modified refresh status after the performance of the one or more extra refresh cycles.

12 Claims, 6 Drawing Sheets

(56) References Cited

U.S. PATENT DOCUMENTS

2008/0294814 A1    11/2008  Gorobets

* cited by examiner

Fig. 1

Self-Refresh Command
200

| CS | CA0 | CA1 | CA2 | CA3 | CA4 | CA5 | CA6 | CA7 | CA8 | CA9 | CA10 | CA11 | CA12 | CA13 |
|----|-----|-----|-----|-----|-----|-----|------|-----|-----|-----|------|------|------|------|
| H  | H   | L   | H   | H   | H   | CID3 | SRE=H |   |     |     |      | CID0 | CID1 | CID2 |
| L  |     |     |     |     |     |     |      | RC  | N3  | N2  | N1   | N0   |      |      |

Fig. 2

Mode Register
300

| MRx bit 5: | RC Mode Enable ||
|---|---|---|
|  | 0 - Disabled | 1 - Enabled |
| MRx bit 4: | RC ||
|  | 0(pull in) | 1(postponed) |
| MRx bits 3:0 |  |  |
| 0000 | 0 | 0 |
| 0001 | 1 | 1 |
| 0010 | 2 | 2 |
| 0011 | 3 | 3 |
| 0100 | 4 | 4 |
| 0101 | 5 | 5 |
| 0110 | 6 | 6 |
| 0111 | 7 | 7 |
| 1000 | 8 | 8 |

PERFORMANCE OF ADDITIONAL REFRESH OPERATIONS DURING SELF-REFRESH MODE

RELATED APPLICATION

The present application is a continuation of and claims the benefit of U.S. patent application Ser. No. 15/184,944, filed on Jun. 16, 2016 and entitled "PERFORMANCE OF ADDITIONAL REFRESH OPERATIONS DURING SELF-REFRESH MODE", which claims the benefit under 35 USC 119(e) of U.S. Provisional Patent Application No. 62/265,054 filed Dec. 9, 2015, both of which are incorporated by reference in their entirety.

TECHNICAL FIELD

Embodiments described herein generally relate to the field of computer memory and, more particularly, to performance of additional refresh operations during self-refresh mode.

BACKGROUND

Dynamic random access memory (DRAM) requires regular refreshing of the contents of the memory to prevent data loss. In operation of a memory device, certain refresh cycles are required in order to maintain memory, but further to maintain compliance with memory standards. A system may be authorized to pull in (issue in advance) or postpone a certain number of refresh commands.

In addition to the required refresh commands, a memory device may perform self-refresh cycles in self-refresh mode. However, in operation, a memory controller is required at time to delay entry to self-refresh mode in order to catch up on the required refreshes. This operation can require significant consumption of power for systems in completing refresh cycles, and then proceeding into a self-refresh mode.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to performance of additional refresh operations during self-refresh mode.

For the purposes of this description, the following definitions apply:

"Dynamic random access memory" or "DRAM" may include a type of physical random access memory (RAM) used for storing bits of data in computing devices, wherein each bit of data is stored in an memory element including a capacitor that must be refreshed (reenergized) to avoid losing the contents of the DRAM. DRAM may include, but is not limited to, memory contained in modules such as DIMMs (Dual In-Line Memory Modules).

DRAM may include DDR (Double Data Rate) technology, where DDR SDRAM (synchronous DRAM) is organized is organized in rows, which are referred to as memory pages (which may generally be referred to herein as pages). (See, JEDEC (Joint Electronic Devices Engineering Council) DDR SDRAM specification, JESD79-3C for DDR3, JESD79-4 for DDR4, and JESD209-3 for LPDDR3 (Low Power DDR.) Further, the memory pages are divided into sections referred to as banks, with each bank having a register associated with it.

"Mobile electronic device" or "mobile device" may include a smartphone, smartwatch, tablet computer, notebook or laptop computer, handheld computer, mobile Internet device, wearable technology, or other mobile electronic device that includes processing capability.

A Refresh (REF) command is issued regularly to a DRAM, and in general a Refresh command is provided each tREFI (refresh interval time). However, to allow for improved efficiency in scheduling and switching between tasks, some flexibility in the absolute refresh interval may be allowed. In a specific example, a certain maximum (such as 8) Refresh commands can be postponed during operation of the DRAM, indicating that at no point in time should more than a total of eight Refresh commands be postponed. In a circumstance in which the maximum number (8) refresh commands are postponed in a row, the resulting maximum interval between the surrounding Refresh commands is limited to, for example, 9×tREFI.

Further, a maximum of eight additional refresh commands can be issued in advance (which is referred to as refresh commands being "pulled in"), with each one refresh command issued in advance resulting in reducing the number of regular refresh commands that are required later by one. Advancing (pulling in) more than eight refresh commands in advance does not further reduce the number of regular refresh commands required later, and thus the resulting maximum interval between two surrounding refresh commands is limited to 9×tREFI.

At any given time, a maximum of sixteen Refresh commands can be issued within 2×tREFI. A Self-Refresh mode may be entered with a maximum of eight refresh commands being postponed. After exiting the Self-Refresh mode with one or more Refresh commands postponed, additional Refresh commands may be postponed to the extent that the total number of postponed Refresh commands (before and after the self-refresh) do not exceed the maximum of eight. In a conventional operation, during the Self-Refresh mode, the number of postponed or pulled-in Refresh commands does not change.

Thus, DRAMs may allow for pulling-in or postponing of a certain number (8) refresh commands. In operation, at times, the memory controller is required to delay entry to Self-Refresh in order to catch up on the required refreshes. However, this process requires additional consumption of power as it delays a time when the system may enter a reduced power state. In conventional operation, there is no provision for communication of refresh status or for a DRAM to catchup or get ahead on refreshes during self-refresh. Rather, the memory controller is responsible to perform all of the required refreshes.

In some embodiments, an apparatus, system, or process may utilize a Refresh Credit mode to allow early entry to self-refresh, during which memory operations may be performed to catch up with or get ahead of refresh cycle requirements. In some embodiments, for an enabled Refresh Credit mode, the DRAM is to perform additional refreshes during a Self-Refresh mode to catch up on one or more postponed refreshes. In some embodiments, the DRAM may further perform additional refreshes during the Self-Refresh mode to allow the memory controller to get ahead on refreshes (increase a number of refreshes advanced), thereby allowing improvement in power consumption and performance of memory operation.

In some embodiments, the DRAM Refresh Credit mode is utilized to catch up on refreshes and to get ahead on refreshes while DRAM is in the Self-Refresh mode. In some embodiments, an apparatus, system, or process enables an early entry to Self-Refresh and, during the Self-Refresh mode, the DRAM is to perform refreshes to catch up on any postponed refreshes. In some embodiments, a new command encoding is defined to indicate to a DRAM a number of refreshes it needs to perform to catch up on refresh cycles. In operation, the performance of refreshes while in the Self-Refresh mode may be used to reduce power consumption as the memory controller and other portions of the system can potentially be powered off (in a reduced power state) during the Self-Refresh mode.

In some embodiments, Self-Refresh may be implemented on a per memory bank basis, group of memory banks, as well as all memory banks, and a Refresh Credit mode may further be extended to per memory bank operation, with communications of refresh status on a per memory bank basis. Refresh Credit mode can be extended to group of memory banks, as well as all memory banks.

Figure 1:
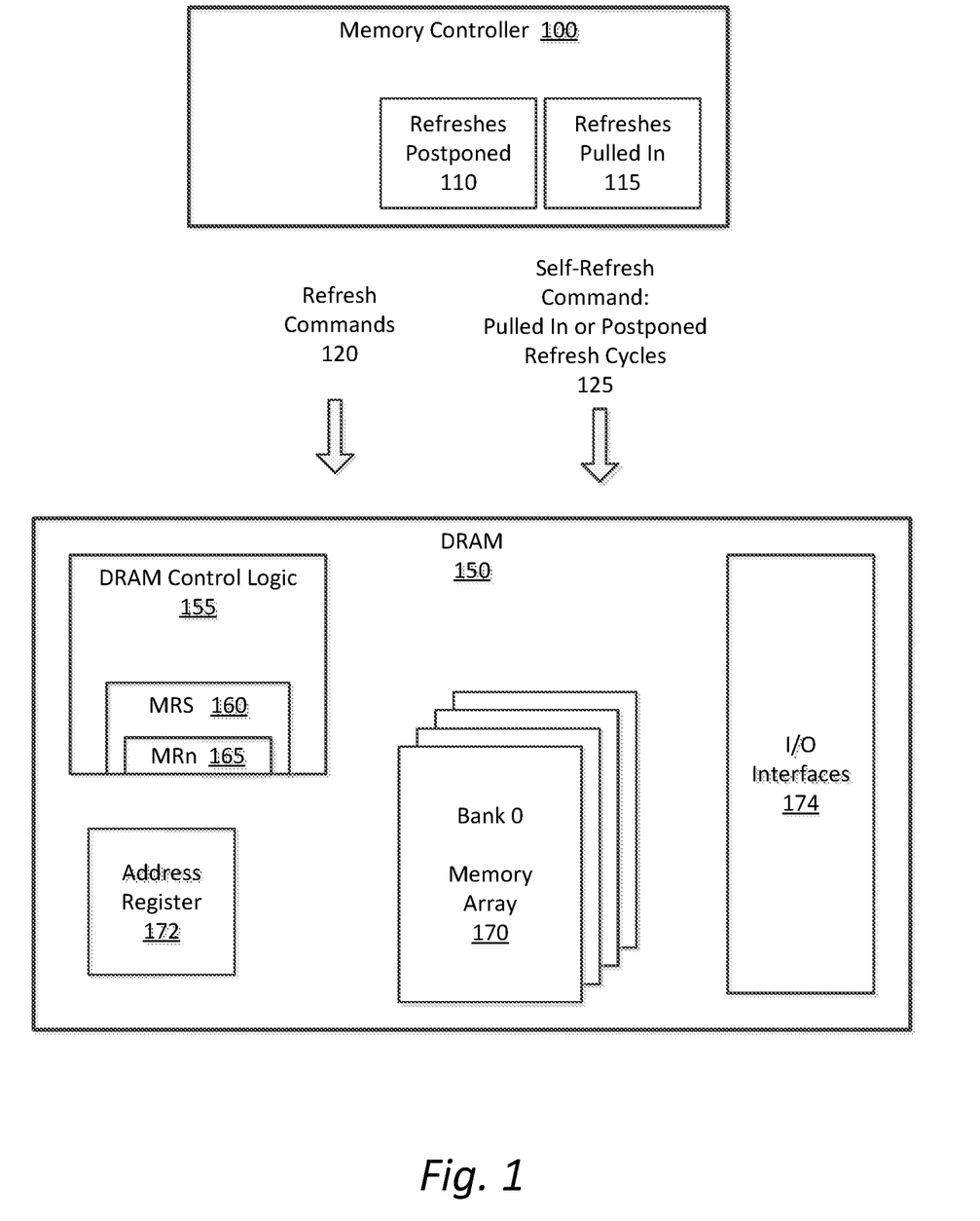
FIG. 1 is an illustration of a memory controller and memory device to perform refresh credit operations according to an embodiment.

FIG. 1 is an illustration of a memory controller and memory device to perform refresh credit operations according to an embodiment. As illustrated in FIG. 1, a memory controller 100 is to provide Refresh commands 120 to a DRAM device 150. The memory controller 100 may postpone a certain number of refreshes 110 up to a maximum number, and may pull in (advance) a certain number of refreshes 115 to get ahead on refresh requests. FIG. 1 provides simplified drawings of the memory controller 100 and DRAM 150 for illustration, and is not intended to illustrate all elements of these components.

In some embodiments, the DRAM includes a control logic 155, the central logic 155 includes a mode register set (MRS) 160. In some embodiments, the mode register set 160 includes a register for a Refresh Credit mode 165, shown as n mode register bits. The DRAM further includes a memory array 170 including multiple memory banks, wherein the memory of the memory backs requires refresh cycles to maintain data stored in the memory banks. FIG. 1 further illustrates an address register 172 and I/O (input-output) interfaces 174.

In some embodiments, the DRAM 150 includes a Refresh Credit mode that allow for the DRAM to catch up on or get further ahead on refresh cycles for the memory controller 100. In some embodiments, the Refresh Credit mode is enabled using a mode register bit of the available register bits 165. In some embodiments, the refresh credit mode may be enabled or disabled by the memory controller 100 via performance of a mode register set write operation.

If the Refresh Credit mode is enabled, then the memory controller may provide a Self-Refresh command 125 that includes data to inform the DRAM if controller has any postponed or pulled-in refreshes, and the number of such postponed or pulled-in refreshes. In some embodiments, the Self-Refresh command may be as illustrated in FIG. 2.

In some embodiments, while in the Self-Refresh mode, the DRAM is to perform additional refresh cycles to enable catching up or getting ahead on a certain number of refresh cycles. In some embodiments, the Refresh Credit is encoded by the DRAM in the mode register bits 165 upon exit from the Self-Refresh mode, wherein the memory controller 100 can access the mode register bits to determine a modified refresh status, and can then continue with refresh operations based on the modified refresh status.

Figure 2:
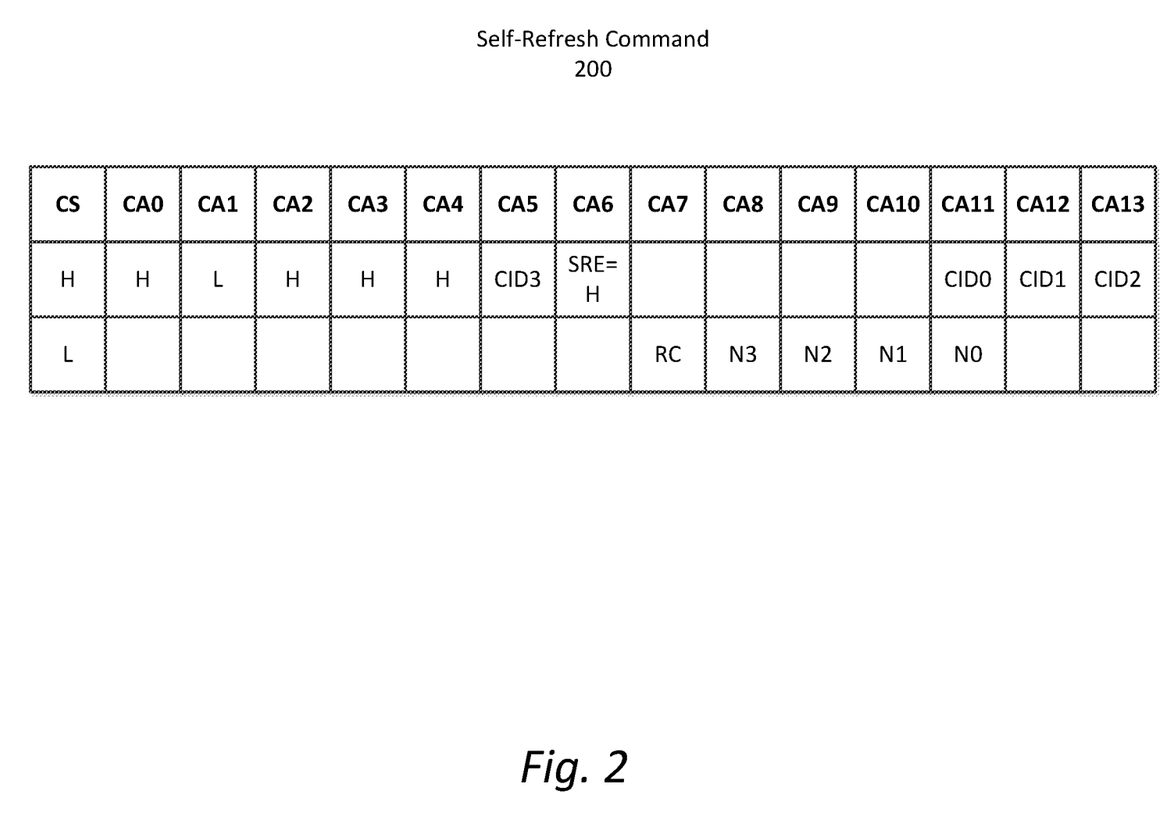
FIG. 2 is an illustration of a command for a self-refresh mode according to an embodiment.

FIG. 2 is an illustration of a command for a self-refresh mode according to an embodiment. As illustrated in FIG. 2, a Self-Refresh command 200 is based on command based entry. In some embodiments, a command is a two-cycle command over Command Address (CA) bits CA0 to CA13 for a Command Strobe (CS) (CS low (L) or high (H)) at a certain value.

In an implementation, there are six Mode Register bits defined, MRx bits 5:0. In some embodiments, a Refresh Credit mode is enabled using Mode Register MRx bit 5. If MRx bit 5=1 then Refresh Credit mode is enabled in DRAM. If bit 5=0, then the Refresh Credit mode is disabled.

In some embodiments, if MRx bit 5 is enabled, then an RC bit (illustrated as encoded in CS L, CA7) in command encoding informs DRAM if the controller has any postponed or pulled-in refreshes, wherein the number of refreshes postponed or pulled in are encoded. In a particular implementation:

RC=0 indicates that refreshes have been pulled-in by a value of N3:N0; and

RC=1 indicates that refreshes have been postponed by a value of N3:N0.

In some embodiments, for a first portion of a refresh implementation, if refreshes have been postponed, then the DRAM will perform additional refreshes in the Self-Refresh state to catch up. In some embodiments, for a second part of a refresh implementation, the DRAM will operate to get ahead on refreshes by pulling-in up to a maximum of eight refreshes in the Self-Refresh state. In some embodiments, upon exit from the Self-Refresh mode, a DRAM is to store the number of refreshes the DRAM was able to catchup on and the additional refreshes it has performed in MRx bits 4:0.

Figure 3:
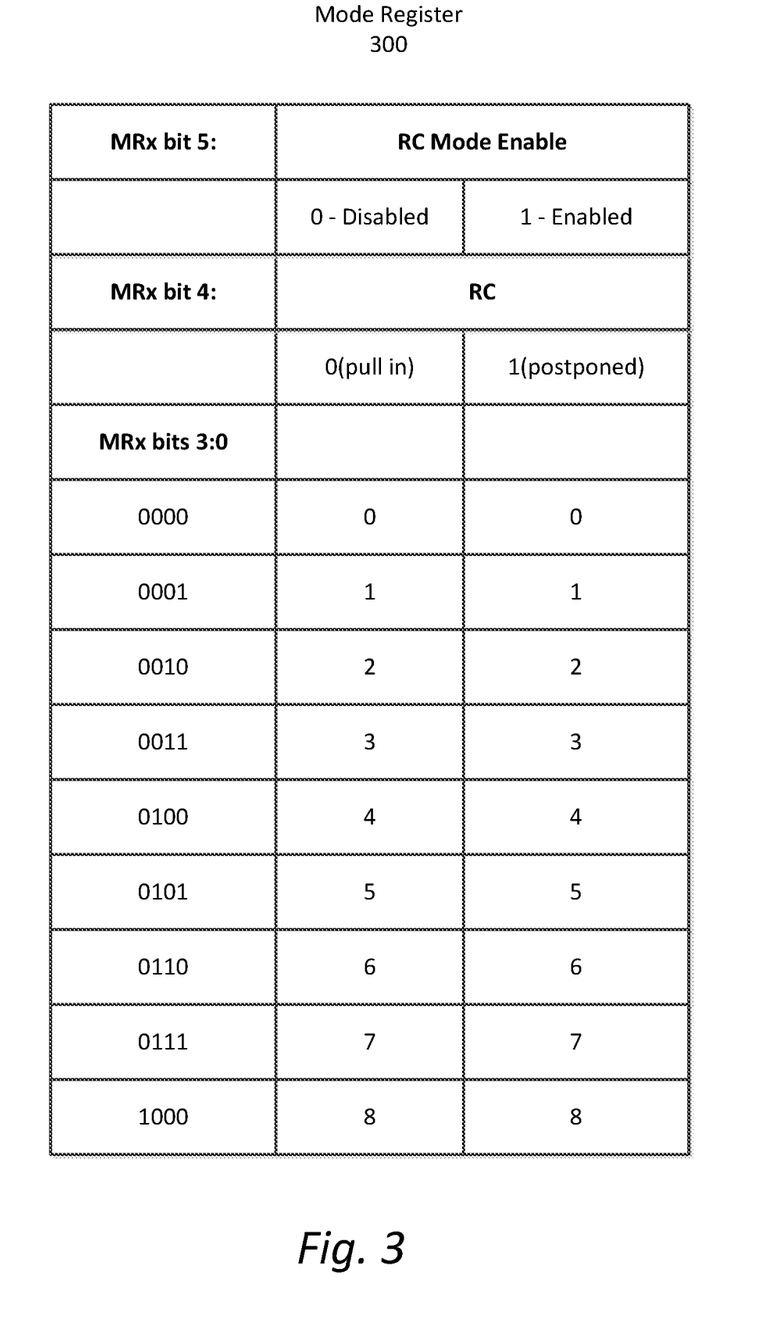
FIG. 3 is an illustration of a mode register according to an embodiment.

FIG. 3 is an illustration of a mode register according to an embodiment. In some embodiments, a mode register 300 includes certain mode register bits, which may be the mode register bits 165 illustrated in FIG. 1.

In a particular implementation, there are six Mode Register bits defined, such register bits being MRx bits 5:0. In some embodiments, a Refresh Credit mode is enabled using Mode Register MRx Bit 5. If bit 5=1 then refresh credit mode is enabled in DRAM. If bit 5=0 then the Refresh Credit mode is disabled.

In some embodiments, on Self-Refresh mode exit, the DRAM is to store data indicating a modified refresh status, the data reflecting the number of refreshes the DRAM was able to catch up on or the additional refreshes the DRAM was able to perform during the self-refresh mode. In some embodiments, the mode register bit may include a refresh credit (RC) status and a number of refreshes it was able to catch up on (N3:N0).

Thus, as illustrated in FIG. 3, the bits of the memory register 300 may indicate refresh status as follows:

MR bit 5: Refresh Credit Mode Enable
  Where bit 5=0 for RC Mode Disabled and bit 5=1 for RC Mode Enabled
MR bit 4: Refresh Credit (RC)
  Where RC=0 for refreshes pulled in (advanced) and RC=1 for refreshes still postponed (deficit)
MR bits 3:0: N3:N0
  Where N3:N0=number of refreshes either postponed or advanced Thus, in an example, RC=0 indicates that refreshes have been pulled-in by a value of N3:N0 (a refresh credit); and RC=1 indicates that refreshed have been postponed by a value of N3:N0 (a remaining refresh deficit). Further, a number of refreshes that are pulled or postponed are indicated in MRx 3:0 as a value from 0 (MRx='0000') to 8 (MRx='1000').

In a particular example, a value of RC with 0 or 1 and N3:N0='0000' would apply when the DRAM is in a state where there are no refreshes that are pulled in or postponed. This value also applies when a Self-Refresh command is issued.

In a particular DRAM implementation of a Self-Refresh state, a DRAM will perform additional refreshes to catchup within 2×tREFI of a first 64 ms (millisecond) window only, where refreshes are issued on an average refresh interval of tREFI. In such implementation, a DRAM may be required to catchup on these extra refreshes within such first 2×tREFI window. This requirement generally will not place any additional power delivery constraints as a result of the extra refreshes. For example, a 16 Gb (gigabit) die with required tRFC of 550 ns (nanoseconds) allows 8 additional refreshes to be performed in 550 ns×8=4.4 μs (microseconds) because refreshes that are pulled in may be performed back to back (thus 550 ns for each refresh, or 4.4 μs for 8 refreshes). The tREFI value is the average refresh interval over a period of time, and tREFI may be 7.8 μs per the DDR3 and DDR4 JEDEC specifications.

In some embodiments, upon catching up with postponed refreshes a next process is for DRAM to get ahead utilizing pulled in (advanced) refreshes. In a particular implementation, a DRAM can pull in a maximum of eight refreshes in any rolling 64 ms (millisecond) window. In operation, the DRAM performs a fixed number of refreshes in a window, such as the 64 ms window. The maximum of eight refreshes that are pulled in are again executed in the DRAM towards a front (beginning) of the window. If a Self-Refresh exit command is received after the maximum of eight refreshes are pulled in, then the DRAM will report a status of RC=1 and N3:N0='1000' in the mode register, such as illustrated in FIG. 3. At end of the 64 ms window, the refreshes that are pulled in are lost. In other words, DRAM has to again execute additional 8 refreshes at the front end of the next 64 ms window. The timing of a Self-Refresh exit command within a 64 ms window will dictate on how many refreshes DRAM is allowed to pull-in.

Figure 4:
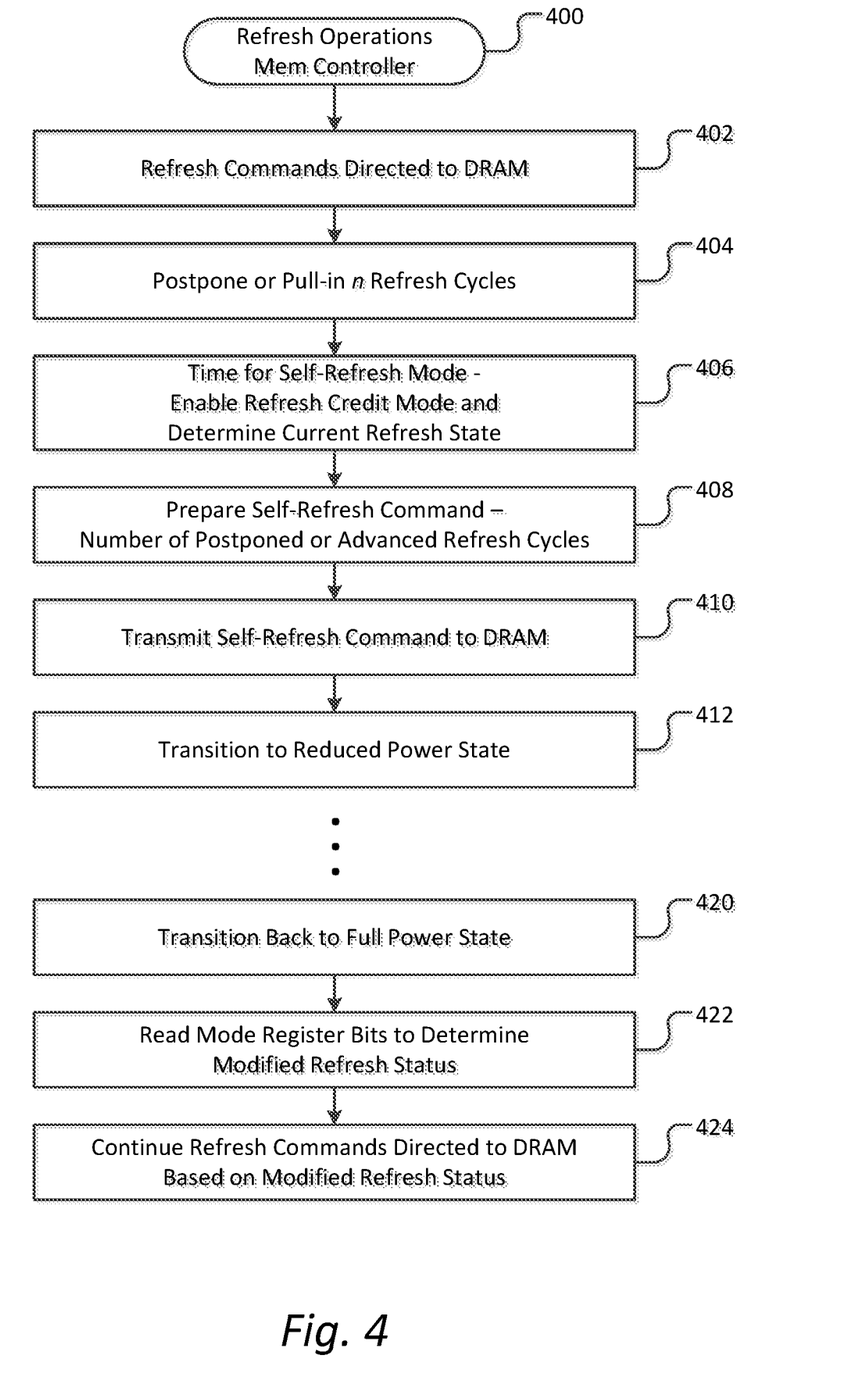
FIG. 4 is a flowchart to illustrate refresh operations for a memory controller according to an embodiment.

FIG. 4 is a flowchart to illustrate refresh operations for a memory controller according to an embodiment. As illustrated in FIG. 4, refresh operations for the memory controller 400 includes providing refresh commands directed to a DRAM device 402, wherein the refresh commands are subject to certain minimum refresh frequency requirements, including the flexibility to postpone or pull in (advance) a certain number of refresh cycles 404.

In some embodiments, upon reaching a time for a Self-Refresh mode, the memory controller may enable a Refresh Credit mode for the DRAM (if not currently enabled) by setting a mode register bit, and determine a current refresh status with regard to postponed or advanced refresh cycles 406. In some embodiments, the memory controller is to prepare a Self-Refresh command including the number of postponed or advanced refresh cycles 408, which may, for example, be in the form of command 200 illustrated in FIG. 2. In some embodiments, the memory controller is to transmit the Self-Refresh command to the DRAM 410, which may be followed by transitioning to a reduced power state 412.

In some embodiments, upon transitioning back to a full power state following the Self-Refresh mode 420, the memory controller is to read the mode register bits of the mode register set of the DRAM (such as illustrated as mode register bits 165 in FIG. 1 and as structured in the mode register 300 illustrated in FIG. 3) to determine a modified refresh status 422, which may include a number of refresh cycles that remain postponed or a number of refresh cycles that are now advanced. In some embodiments, the memory controller is to continue transmission of refresh commands directed to the DRAM based on the modified refresh status 424.

Figure 5:
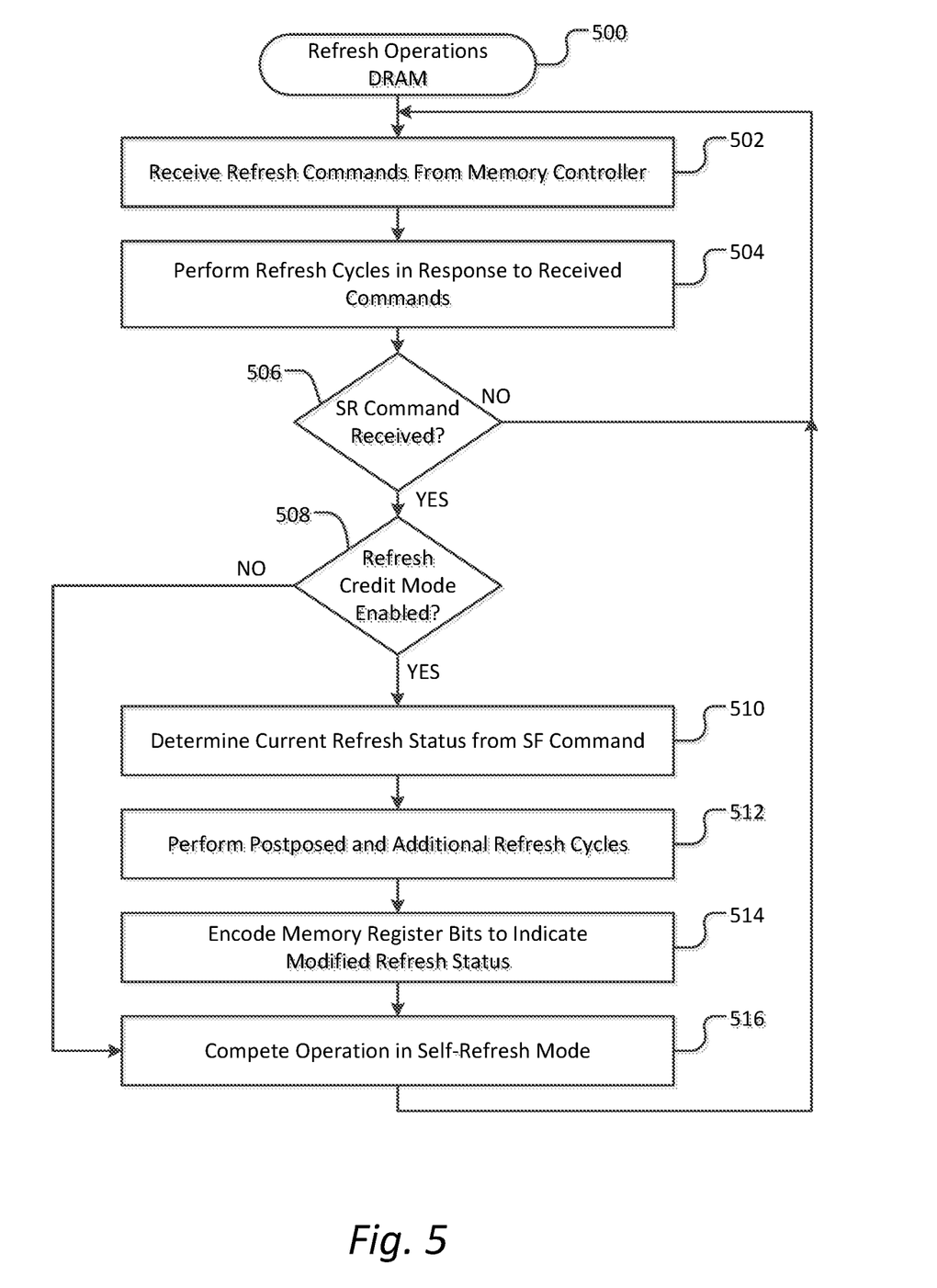
FIG. 5 is a flowchart to illustrate refresh operations for a DRAM device according to an embodiment.

FIG. 5 is a flowchart to illustrate refresh operations for a DRAM device according to an embodiment. As illustrated in FIG. 5, a DRAM device may receive refresh commands from a memory controller 502, wherein the refresh commands are subject to certain minimum refresh frequency requirements, the requirements including flexibility to postpone or pull in (advance) a certain number of refresh cycles, and the DRAM is to perform the refresh cycles in response to the received commands 504.

In some embodiments, upon receipt of a Self-Refresh command from the memory controller 506, if a Refresh Credit mode is currently enabled 508, the command logic of the DRAM is to determine a current refresh status from the self-refresh command 510, which command may be as illustrated as the self-refresh command 200 illustrated in FIG. 2. In some embodiments, the command logic is to provide for the DRAM to perform one or more postponed memory refresh cycles (if there are existing postponed refresh cycles) and, if possible, to perform one or more additional refresh cycles 512.

In some embodiments, the control logic of the DRAM is further to encode mode register bits to indicate a modified refresh status including a current number of postponed or advanced refresh cycles after the performance of refresh cycles during the self-refresh mode 514. In some embodiments, the coding of the mode register bits may be as illustrated for mode register 300 illustrated in FIG. 3. The DRAM may then complete operation in the self-refresh mode 516 and continue with normal operation, including receiving refresh commands from the memory control 502.

Figure 6:
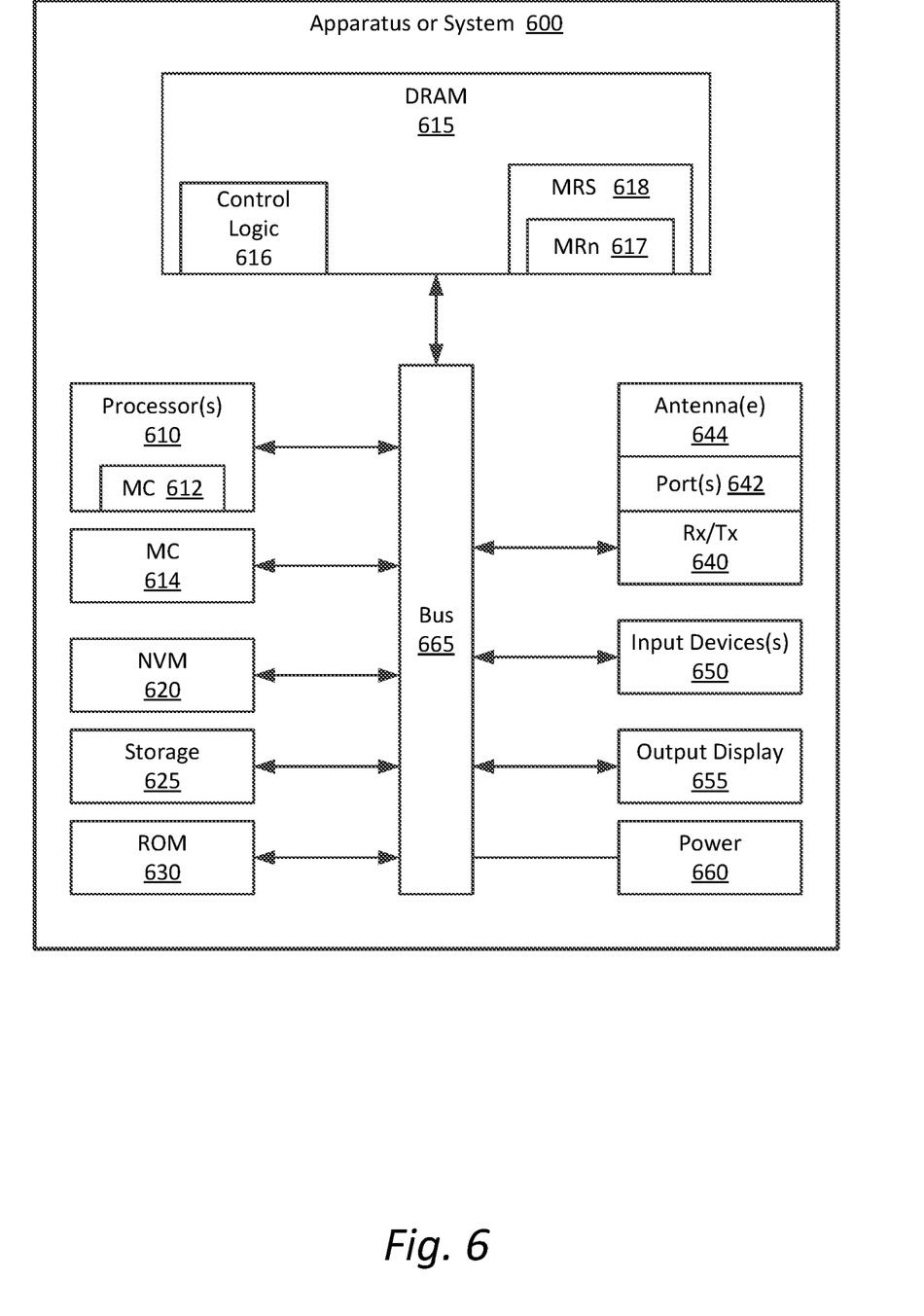
FIG. 6 is an illustration of an apparatus or system including a memory providing a refresh credit mode according to an embodiment.

FIG. 6 is an illustration of an apparatus or system including a memory providing a refresh credit mode according to an embodiment. In this illustration, certain standard and well-known components that are not germane to the present description are not shown. Elements shown as separate elements may be combined, including, for example, an SoC (System on Chip) combining multiple elements on a single chip. An apparatus or system 600 may include, but is not limited to, a mobile device.

In some embodiments, the apparatus or system 600 includes processing means (or processing units) such as one or more processors 610 coupled to one or more buses or interconnects, shown in general as bus 665. The processors 610 may comprise one or more physical processors and one or more logical processors. In some embodiments, the processors may include one or more general-purpose processors or special-processor processors. The bus 665 is a communication means for transmission of data. The bus 665 is illustrated as a single bus for simplicity, but may represent multiple different interconnects or buses and the component connections to such interconnects or buses may vary. The bus 665 shown in FIG. 6 is an abstraction that represents any one or more separate physical buses, point-to-point connections, or both connected by appropriate bridges, adapters, or controllers. In some embodiments, a processor 610 includes a memory controller 612 or operates with an external memory controller 614.

In some embodiments, the apparatus or system 600 further comprises a random access memory (RAM) or other dynamic storage device or element as a main memory for storing information and instructions to be executed by the processors 610. Main memory may include, but is not limited to, dynamic random access memory (DRAM) 615. The DRAM may include elements illustrated for DRAM 150 in FIG. 1. In some embodiments, the DRAM 615 includes control logic 616 to provide memory control operation and a mode register 617 to provide for enabling or disabling certain modes. In some embodiments, the control logic 616 includes logic to perform additional memory refreshes in a self-refresh mode when a refresh credit mode is active. In some embodiments, the DRAM is to receive a self-refresh command, such as command 200 illustrated in FIG. 2, providing information regarding a current refresh status, including a number of refresh cycles that are either postponed or advanced. In some embodiments, the mode register set 617 includes mode register bits 618, wherein such bits may be utilized to provide information regarding a modified refresh status, such as illustrated in the mode register 300 illustrated in FIG. 3, including a number of refresh cycles that are postponed or advanced after the end of the self-refresh mode.

In some embodiments, the memory controller 612-614 is operable to write to the mode register set 617 to enable or disable the refresh credit mode, and, with the refresh credit enabled, to provide a self-refresh command to the DRAM 615, the self-refresh command providing information regarding a current refresh status, including a number of refresh cycles that are postponed or pulled in. The operations for the refresh credit mode may be as illustrated in FIGS. 4 and 5.

The apparatus or system 600 also may comprise a non-volatile memory (NVM) 620; a storage device such as a solid state drive (SSD) 625; and a read only memory (ROM) 630 or other static storage device for storing static information and instructions for the processors 610. NVM 620 can include single or multi-threshold level NAND flash memory, NOR flash memory, single or multi-level phase change memory (PCM), resistive memory, three dimensional (3D) cross point memory, nanowire memory, ferroelectric transistor random access memory (FeTRAM), magnetoresistive random access memory (MRAM) memory that incorporates memristor technology, spin transfer torque random access memory (STT)-MRAM, write in place non-volatile MRAM (NVMRAM) such as phase change memory, and the like, including combinations thereof.

In some embodiments, the apparatus or system 600 includes one or more transmitters or receivers 640 coupled to the bus 665 to provide wired or wireless communications. In some embodiments, the apparatus or system 600 may include one or more antennae 644, such as dipole or monopole antennae, for the transmission and reception of data via wireless communication using a wireless transmitter, receiver, or both, and one or more ports 642 for the transmission and reception of data via wired communications. Wireless communication includes, but is not limited to, Wi-Fi, Bluetooth™, near field communication, and other wireless communication standards.

In some embodiments, apparatus or system 600 includes one or more input devices 650 for the input of data, including hard and soft buttons, a joy stick, a mouse or other pointing device, a keyboard, voice command system, or gesture recognition system.

In some embodiments, the apparatus or system 600 includes an output display 655, where the display 655 may include a liquid crystal display (LCD) or any other display technology, for displaying information or content to a user. In some environments, the display 655 may include a touch-screen that is also utilized as at least a part of an input device 650. Output display 655 may further include audio output, including one or more speakers, audio output jacks, or other audio, and other output to the user.

The apparatus or system 600 may also comprise a battery or other power source 660, which may include a solar cell, a fuel cell, a charged capacitor, near field inductive coupling, power adapter, or other system or device for providing or generating power in the apparatus or system 600. The power provided by the power source 660 may be distributed as required to elements of the apparatus or system 600.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a memory device includes one or more memory banks; a mode register set, the mode register including a first set of mode register bits; and a control logic to provide control operations for the memory device, the operations including refresh operations for the one or more memory banks in a refresh credit mode. In some embodiments, the control logic is to perform one or more extra refresh cycles in response to receipt of a self-refresh command, the self-refresh command to provide current refresh status information; and the control logic is to store information in the first set of mode register bits regarding a modified refresh status after the performance of the one or more extra refresh cycles.

In some embodiments, the current refresh status information in the mode register command includes a number of refresh cycles that are postponed for the memory device or a number of refresh cycles that are advanced for the memory device.

In some embodiments, the first set of mode register bits includes a number of refresh cycles that remain postponed for the memory device or a number of refresh cycles that are advanced for the memory device.

In some embodiments, the memory device is a dynamic random access memory (DRAM) device. In some embodiments, the DRAM device is a double data rate (DDR) synchronous DRAM (SDRAM) memory device.

In some embodiments, one or more non-transitory computer-readable storage mediums having stored thereon data representing sequences of instructions that, when executed by one or more processors, cause the one or more processors to perform operations including providing a series of refresh commands to a memory by a memory controller, wherein providing the series of refresh commands may include postponing a number of refresh commands or advancing a number of refresh commands; transmitting a self-refresh command to the memory by the memory controller in a refresh credit mode, the self-refresh command including current refresh status information; upon an end of a self-refresh mode, obtaining modified refresh status information from the memory; and continuing the series of refresh commands based at least in part on the modified status information.

In some embodiments, the current refresh status information includes a number of refresh commands that are postponed or a number of refresh commands that have been advanced.

In some embodiments, the modified refresh status information includes a number of refresh commands that remain postponed or a number of refresh commands that are advanced after the self-refresh mode.

In some embodiments, obtaining the modified refresh status information includes reading a set of register bits of the memory.

In some embodiments, reading the set of register bits of the memory includes reading a first bit to determine whether a value of a subset of the register bits represents a number of refresh commands that remain postponed or a number of refresh commands that are advanced after the self-refresh mode.

In some embodiments, an apparatus includes means for providing a series of refresh commands to a memory by a memory controller, wherein providing the series of refresh commands may include postponing a number of refresh commands or advancing a number of refresh commands; means for transmitting a self-refresh command to the memory by the memory controller in a refresh credit mode, the self-refresh command including current refresh status information; means for obtaining modified refresh status information from the memory upon an end of a self-refresh mode; and means for continuing the series of refresh commands based at least in part on the modified status information.

In some embodiments, the current refresh status information includes a number of refresh commands that are postponed or a number of refresh commands that have been advanced.

In some embodiments, the modified refresh status information includes a number of refresh commands that remain postponed or a number of refresh commands that are advanced after the self-refresh mode.

In some embodiments, the means for obtaining the modified refresh status information includes means for reading a set of register bits of the memory.

In some embodiments, the means for reading the set of register bits of the memory includes means for reading a first bit to determine whether a value of a subset of the register bits represents a number of refresh commands that remain postponed or a number of refresh commands that are advanced after the self-refresh mode.

In some embodiments, a method includes receiving a series of refresh commands at a memory from a memory controller and perform refresh cycles in response to the refresh commands; receiving a self-refresh command at the memory from the memory controller in a refresh credit mode, the self-refresh command including current refresh status information; entering a self-refresh mode in response to the self-refresh command; performing one or more extra refresh cycles during the self-refresh mode; storing modified refresh status information based at least in part on the extra refresh cycles performed in the self-refresh mode; and exiting the self-refresh mode.

In some embodiments, the current refresh status information includes a number of refresh commands that are postponed or a number of refresh commands that have been advanced.

In some embodiments, the modified refresh status information includes a number of refresh commands that remain postponed or a number of refresh commands that are advanced after the performance of the one or more extra refresh cycles.

In some embodiments, storing the modified refresh status information includes storing the information in a set of register bits of the memory.

In some embodiments, storing the information in the set of register bits of the memory includes writing a first bit to indicate whether a value of a subset of the register bits represents a number of refresh commands that remain postponed or a number of refresh commands that are advanced after the self-refresh mode.

In some embodiments, a system includes one or more processors for processing of data; a memory controller for control of computer memory; a memory device for storage of data for the one or more processors; and a transmitter and receiver for transfer of data in wireless communications, the system including one or more antennae for data transmission. In some embodiments, the memory device includes one or more memory banks, a mode register set, the mode register including a first set of mode register bits, and a control logic to provide control operations for the memory device, including refresh operations for the one or more memory banks in a refresh credit mode. In some embodiments, the control logic is to perform one or more extra refresh cycles in response to receipt of a self-refresh command, the self-refresh command to provide current refresh status information; and the control logic is to store information in the first set of mode register bits regarding a modified refresh status after the performance of the one or more extra refresh cycles.

In some embodiments, the current refresh status information in the mode register command includes a number of refresh cycles that are postponed for the memory device or a number of refresh cycles that are advanced for the memory device.

In some embodiments, the first set of mode register bits includes a number of refresh cycles that remain postponed for the memory device or a number of refresh cycles that are advanced for the memory device.

In some embodiments, the memory device is a dynamic random access memory (DRAM) device.

In some embodiments, the system is to enter a reduced power mode after transmission of the self-refresh command.

In some embodiments, the system further includes one or more of a display communicatively coupled to the one or more processors; or a battery communicatively coupled to the one or more processors.

What is claimed is:

1. A memory device comprising: one or more memory banks;
    a mode register set, the mode register set including a first set of mode register bits; and
    a control logic to provide control operations for the memory device, the operations including refresh operations for the one or more memory banks in a refresh credit mode;
    wherein the control logic is to perform one or more extra refresh cycles in response to receipt of a self-refresh command, the self-refresh command to provide current refresh status information, wherein, the current refresh status information in the self-refresh command includes a number of refresh cycles that are postponed for the memory device or a number of refresh cycles that are advanced for the memory device; and
    wherein the control logic is to store information in the first set of mode register bits regarding a modified refresh status after the performance of the one or more extra refresh cycles.

2. The memory device of claim 1, wherein the first set of mode register bits includes a number of refresh cycles that remain postponed for the memory device or a number of refresh cycles that are advanced for the memory device.

3. The memory device of claim 1, wherein the memory device is a dynamic random access memory (DRAM) device.

4. The memory device of claim 3, wherein the DRAM device is a double data rate (DDR) synchronous DRAM (SDRAM) memory device.

5. One or more non-transitory computer-readable storage mediums having stored thereon data representing sequences of instructions that, when executed by one or more processors, cause the one or more processors to perform operations comprising:
    providing a series of refresh commands to a memory by a memory controller, wherein providing the series of refresh commands may include postponing a number of refresh commands or advancing a number of refresh commands;
    transmitting a self-refresh command to the memory by the memory controller in a refresh credit mode, the self-refresh command including current refresh status information, wherein, the current refresh status information in the self-refresh command includes a number of refresh cycles that are postponed for the memory device or a number of refresh cycles that are advanced for the memory device;
    upon an end of a self-refresh mode, obtaining modified refresh status information from the memory; and
    continuing the series of refresh commands based at least in part on the modified status information.

6. The medium of claim 5, wherein the modified refresh status information includes a number of refresh commands that remain postponed or a number of refresh commands that are advanced after the self-refresh mode.

7. The medium of claim 6, wherein obtaining the modified refresh status information includes reading a set of register bits of the memory.

8. The medium of claim 7, wherein reading the set of register bits of the memory includes reading a first bit to determine whether a value of a subset of the register bits represents a number of refresh commands that remain postponed or a number of refresh commands that are advanced after the self-refresh mode.

9. A method performed by a memory, comprising:

receiving a series of refresh commands at a memory from the memory controller and performing refresh cycles in response to the refresh commands;

receiving a self-refresh command at the memory from the memory controller in a refresh credit mode, the self-refresh command including current refresh status information, wherein, the current refresh status information in the self-refresh command includes a number of refresh cycles that are postponed for the memory device or a number of refresh cycles that are advanced for the memory device;

entering a self-refresh mode in response to the self-refresh command;

performing one or more extra refresh cycles during the self-refresh mode;

storing modified refresh status information based at least in part on the extra refresh cycles performed in the self-refresh mode; and exiting the self-refresh mode.

10. The method of claim 9, wherein the modified refresh status information includes a number of refresh commands that remain postponed or a number of refresh commands that are advanced after the performance of the one or more extra refresh cycles.

11. The method of claim 10, wherein storing the modified refresh status information includes storing the information in a set of register bits of the memory.

12. The method of claim 11, wherein storing the information in the set of register bits of the memory includes writing a first bit to indicate whether a value of a subset of the register bits represents a number of refresh commands that remain postponed or a number of refresh commands that are advanced after the self-refresh mode.

* * * * *